United States Patent [19]

Perra et al.

[11] Patent Number: 4,638,430
[45] Date of Patent: Jan. 20, 1987

[54] EAROM AND EEPROM DATA STORAGE MANAGEMENT

[75] Inventors: Raymond C. Perra, Windsor Locks; Stephen B. Wilmot, Farmington; John E. Games, Granby, all of Conn.

[73] Assignee: United Technologies Corporation, Hartford, Conn.

[21] Appl. No.: 514,214

[22] Filed: Jul. 15, 1983

[51] Int. Cl.⁴ .............................................. G06F 15/00
[52] U.S. Cl. ..................................... 364/300; 364/900
[58] Field of Search ........................... 360/5, 6, 53, 60;
364/178, 179, 200 MS File, 900 MS File, 424, 300; 365/31, 96, 228, 229; 371/10, 11, 21, 4; 244/96, 175

[56] References Cited

U.S. PATENT DOCUMENTS 4,064,558 12/1977 Hughes et al. ...................... 364/900

Primary Examiner—Gareth D. Shaw
Assistant Examiner—Jonathan C. Fairbanks
Attorney, Agent, or Firm—Dominic J. Chiantera

[57] ABSTRACT

Recurring data sample values of a common parameter are stored in nonvolatile memory at different addresses so as to limit the maximum number of entries at any one location to less than that which results in loss of storage ability.

4 Claims, 6 Drawing Figures

EAROM AND EEPROM DATA STORAGE MANAGEMENT

DESCRIPTION

1. Technical Field

This invention relates to electronic memory storage devices, and more particularly to nonvolatile, alterable memory devices.

2. Background Art

Memory devices provide indefinite storage of signal information provided by a signal processor. The signals are stored within the memory at various addressable locations. In volatile memories the information remains stored only in the continued presence of applied excitation voltage; it is lost in the absence of power. Alternatively, nonvolatile memories maintain stored signal content even in the absence of applied power; at least for a specified duration.

Nonvolatile memories are useful in data acquisition systems where information must be recorded and its value updated periodically. Typically in avionic systems where a data acquisition system may acquire data on aircraft operating parameters, such as engine speed, fuel pressure, etc., the stored data integrity is critical; it must be maintained throughout the flight schedule, while still being capable of being updated.

Most typical of the nonvolatile memories are the electrically alterable read only memory (EAROM) and the electrically erasable programmable read only memory (EEPROM) devices. Both allow stored data to be written over in situ, and preserve the stored data throughout power interruptions for later readout by ground based equipment. In both EAROM and EEPROM memories the updating process involves a sequence of first erasing the entire former data unit (e.g. word, byte, or nibble) and then entering the new data value at the same address. The step of first erasing is required due to the physical properties of the materials involved, and the memory's designed operating system. This means that a single bit update requires that the entire data unit be erased and rewritten.

Both EAROM and EEPROM devices are sensitive to excessive write-overs at any one address location. This sensitivity is characterized by a "burn-out"; i.e. a loss in ability to store the information intact throughout a power interruption. As a result, device manufacturers specify a maximum number of write cycles; typically on the order of 10,000 ($10^4$). While this maximum write limit is consertive, it establishes the upper limit of use over which the statistical probability of failure of the memory is defined. As such, original equipment manufacturers using the memory devices in systems requiring guaranteed mean time between failures (MTBF) must have reliable statistical failure data for the memory. The manufacturer specified maximum write value must be considered to be the actual maximum in any conservative design approach, although higher data sampling rates may result in total write-overs of a given location in excess of that specified.

DISCLOSURE OF INVENTION

The object of the present invention is to provide a method for writing common data parameters into a nonvolatile memory with a plurality of addressable storage locations, each capable of nonvolatile storage of signal data over a specified maximum number of recurring cycles.

According to the present invention, successive data values of a common parameter to be entered over a recurring number of cycles greater than the maximum specified, are stored at different addressable signal locations within a common data signal block location in memory, the number of different addressable locations at least equal to the ratio of the predicted number of recurring data entry cycles divided by the manufacturer's specified maximum number or recurring cycles, the signal block locations identified by a state count derived from the signal pointer.

The data management method of the present invention ensures that nonvolatile memory storage will not degrade with excessive "write-overs" at any one location. Instead, rotating the data signals through succeeding addressable locations within a signal block designated for the parameter absolutely prevents excess write-overs at any one location. The repetition frequency for each data location depends on the ratio of the expected maximum required data storage cycle divided by the maximum specified for each location by the memory device manufacturer.

These and other objects, features and advantages of the present invention will become more apparent in the light of the following detailed description of a best mode embodiment thereof, as illustrated in the accompanying drawings.

BEST MODE FOR CARRYING OUT THE INVENTION

Figure 2:
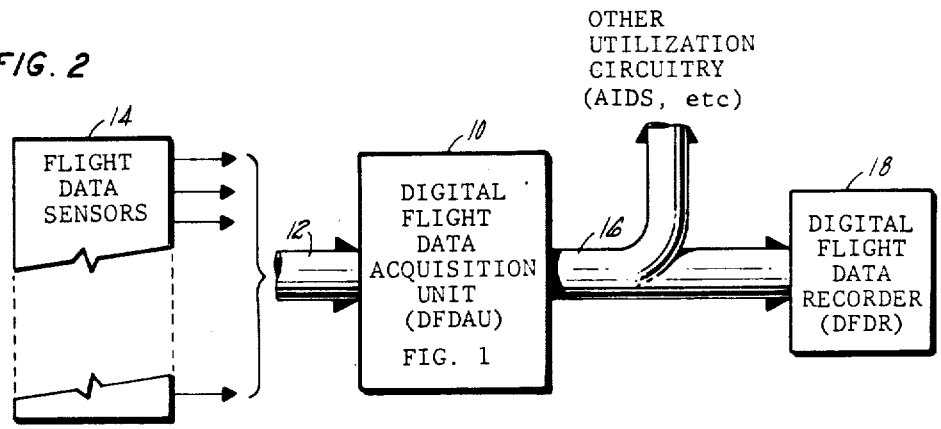
FIG. 2 is a simplified block diagram illustrating an applied use of the apparatus of FIG. 1.

As stated hereinbefore, one use of EAROM and EEPROM memories is in airborne flight data acquisition equipment, such as a Digital Flight Data Acquisition Unit (DFDAU) which receives sensed data from various operating systems of the aircraft, conditions the received data and converts it to a digital format compatible with the information system microprocessor. The conditioned data is presented to different utilization equipment, e.g. digital flight data recorder (DFDR), navigational AIDS, etc. FIG. 2 is a simplified illustration of a DFDAU 10 with data inputs on lines 12 from a plurality of flight data sensors 14, and conditioned output signals on lines 16 to the DFDR 18 and the other utilization circuitry.

Figure 1:
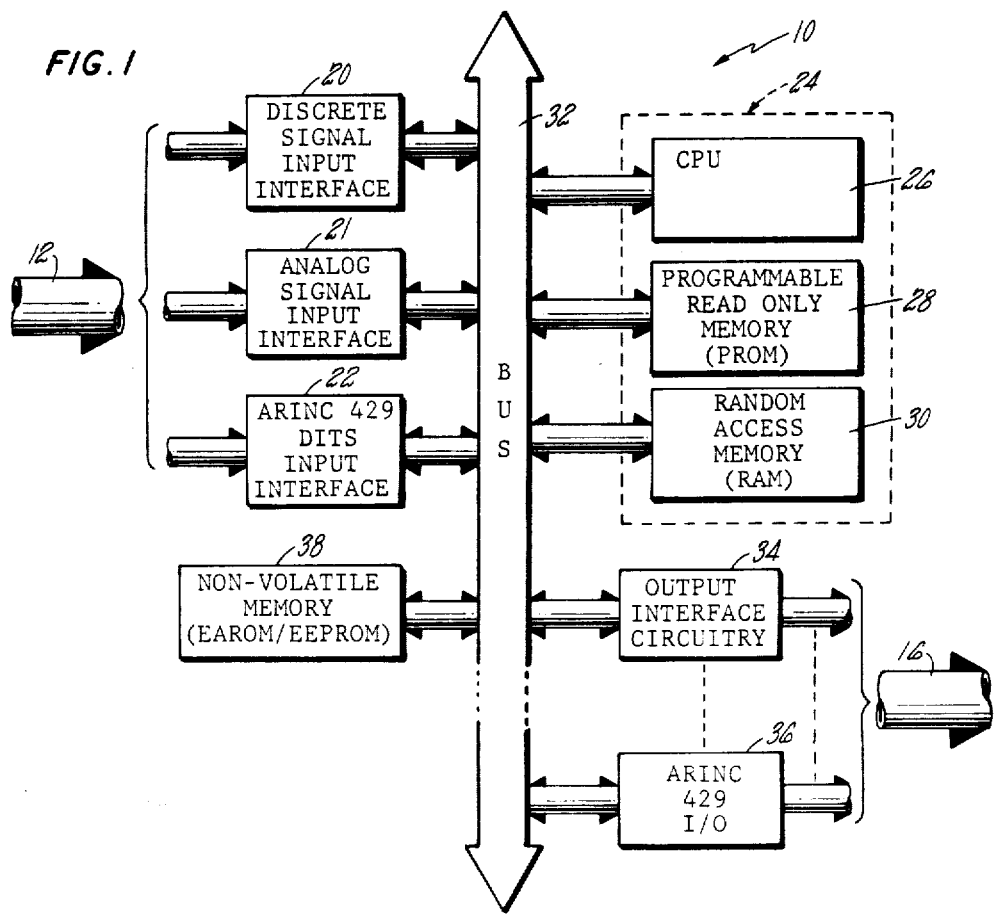
FIG. 1 is a system block diagram of apparatus in which the present invention may be used.

Referring to FIG. 1, in a system block diagram of the DFDAU 10, input data on the lines 12 is received at one of the three signal interfaces: a discrete signal interface 20, an analog signal interface 21, and an AIRINC 429 digital information transfer system (DITS) interface 22. The three interfaces are required for conditioning different type signal formats presented from the signal sources. Each converts the received data into a digital format compatible with the DFDAU signal processor 24. The processor, of a type known in the art, includes a CPU 26, a programmable read only memory (PROM) 28, and a random access memory (RAM) 30. The processor accesses the interfaces via the system bus 32 (which includes control, address, and data buses) using software techniques and methods known to those skilled in the software programming art. The conditioned information from each interface is stored in a direct memory access (DMA) within the associated interface for later retrieval by the processor.

Each interface DMA output is multiplexed to the DFDAU output interface 34 via the system bus. A special AIRINC 429 output interface 36 is also included, which converts the DFDAU digital format into a specified AIRINC-type format (64 word per second (WPS) Harvard biphase and a 128 WPS BRZ). The output interface also provides a fault discrete signal notifying other user equipment (including the DFDR) of the DFDAU health status; the health check is provided by built-in test equipment (BITE) routines performed by the processor 24 periodically throughout the operating cycle of the DFDAU.

The data acquisition unit includes a nonvolatile EAROM or EEPROM memory 38, for storing data which must be modified periodically but saved throughout a power down condition. In this embodiment the data stored in the nonvolatile memory is the data result of BITE test routines for the DFDAU. As known, the DFDR cannot function without the DFDAU which receives data from various sensor signal groups of the aircraft. Therefore, recording system integrity is dependent on the data sensors and sensor signal conditioning circuitry, the data acquisition unit (DFDAU), the flight data recorder (DFDR), and the aircraft interconnecting wiring.

The extended nature of the components involved in the overall system, make reliability of the system a major concern. The flight data recording system includes self testing to determine system integrity. One such self test system is disclosed in a copending application of common assignee entitled "DIGITAL FLIGHT DATA RECORDING SYSTEM", U.S. Ser. No. 404,063 (UTC Project No. H1199-ED) filed Aug. 2, 1982 by M. Ratchford, now U.S. Pat. No. 4,470,116. As disclosed therein, the DFDAU nonvolatile memory 38 stores signals representative of a deterministic model of a flight mode algorithm which defines a generic aircraft flight profile by preselected modes; each mode defining an operating station of the flight profile. The flight mode algorithm calculates the nominal values of a number of dependent, sensed data parameters as provided by the flight data sensors 14, (FIG. 2) in terms of the sensed values of other independent, sensed parameters. At each different station of the flight profile the DFDAU processor 24 compares the actual sensed parameter value with the corresponding calculated value to determine sensor accuracy. In this way the accuracy of the sensed parameters to be recorded and the actual flight data recording operation are corroborated.

Execution of the model algorithm is continuous throughout the flight. The test results are stored in the nonvolatile memory. If the actual number of memory write overs exceeds the maximum specified, the data stored at that address experiences a "soft failure", e.g. limited retention or complete nonacceptance at that location. The present data storage management procedure steers the test routine data through different locations in nonvolatile memory so as to limit the number of write overs in each location to less than that specified by the manufacturer.

The present data storage management method defines a plurality of addressable signal storage locations in memory which collectively form a "data block", i.e. a single parameter depository. Data blocks are defined for each stored parameter which, due to its frequency of recording, would exceed the maximum specified number of write overs if stored in single location. Instead, the parameter is recorded in each address location of its data block sequentially, or through periodic rotation, as discussed hereinafter. The actual number of addressable locations in each data block varies with the parameter. The minimum number is equal to the ratio of the required number of entries of the parameter into memory in the operating life of the system, divided by the specified maximum number of entries allowed.

In typical avionic applications with extended equipment operating life requirements, a high frequency of recording parameter such as the "flight mode indicator" flight profile station, (e.g. roll out, engine start, climb cruise, etc.) may be written into the nonvolatile memory ten times per flight. The recorded data must be capable of being retained in memory for extended power down intervals; as long as 72 hours. For an assumed five flights per day, five days a week and 50 weeks per year, there may be a total of 160,000 data entries over a 12 year operating life. With a manufacturers guaranteed 10,000 entry life cycle the required number of write overs exceeds the guarantee by a factor 16; the ratio of the two numbers. The data block for this flight mode parameter would include a minimum of 16 addressable locations in memory, reducing the duty cycle for any one storage location by a factor of 16 over the system operating life.

Figure 3:
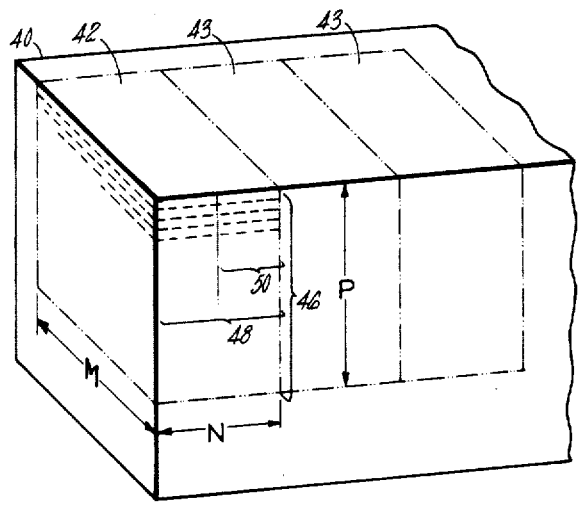
FIG. 3 is a perspective visual aid used in the description of the present invention.

Referring to FIG. 3, in simplified perspective illustration intended only as a visual aid of the concept, a portion of the nonvolatile memory mass 40 (e.g. the total volume of addressable locations within the architecture of a hypothetical memory) is designated for data block storage. Three data blocks 42–44 are illustrated in phantom in FIG. 3. Each, as illustrated by data block 42, includes a plurality of addressable signal storage locations 46, each a selected number of bits wide (e.g. eight bit byte 48, or four bit nibble 50). The actual storage capacity of the block may be established as a selected (P) number of (N) bit storage locations per "page", and a selected (M) number of pages. However, the selected number of addressable locations in each data block may be distributed in any manner deemed feasible; per page, or a number of pages. Similarly, the addressable locations need not be contiguous as shown but instead may be spread out in "peppered" fashion throughout the memory, as long as each are accessible by proper address location identification. In the present example for the flight mode indicator the minimum 16 locations represents a high number; many applications require a less number of storage locations.

As each of the high recording frequency parameters are sensed the value of each is stored at one of the data block addresses. That address is determined by a "data block pointer"; a multiple bit count whose present state count value determines the present address in the data block at which a present data sample is to be stored. In the present embodiment the pointer value is added to a base address for the data block which is stored in program memory. To illustrate, if the flight mode samples are to be stored in one of sixteen locations, e.g. decimal 61 to 75 (hypothetical) the pointer is stored in a separate address location, e.g. 50. The base address is 61 (the lowest block address) and is stored in program memory. The DFDAU processor reads the pointer value and adds it to the base address to create the "pointed address" at which the present sample is to be stored. If the pointer is 0 the pointed address is 61+0=61. If the pointer is 5 the pointed address is 66.

The pointer itself may be either a dedicated counter within the DFDAU operating system, or an internal counter of the processor. As will be described hereinafter, when possible the pointer itself is an operating parameter, or indicator already present in the system. For example, as described hereinafter with respect to FIG. 5, the DFDAU includes a three digit binary coded decimal (BCD) message counter which tracks the number of messages transmitted by the DFDAU. The message count is one of the higher frequency recorded parameters, such that it must be circulated periodically through its own data block. In the present embodiment the message count BCD value is used as the pointer, instead of a dedicated pointer. Of course, in the present data management method, which is intended to circulate the parameters through different addresses within the data block so as not to exceed the maximum specified for a particular location, the pointing may be done in a number of ways. The values of a given parameter may be stored sequentially at succeeding locations in the data block within a cycle, from a first to a last, and then repeated cycle after cycle. Alternatively, the data samples may be stored at a single location up to a selected number not to exceed the maximum specified, and when the number of write overs equals the selected number a next address is used for next selected number of recordings. In the case of the flight mode indicator the samples for each flight are stored consecutively in the same address location within the block. Following each flight the flight mode indicator pointer is then incremented so that in the next succeeding flight the 10 parameters are stored in another one of the locations. The process is continued through 16 locations, after which it is repeated again beginning with the first location. Although the flight mode indicator recording is only ten times that of the specified maximum, 16 locations were used because a four bit pointer was chosen.

Figure 4:
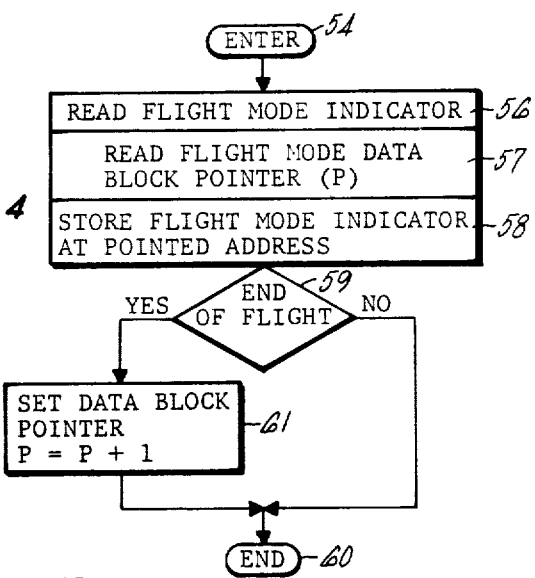
FIG. 4 is a flow chart diagram of one embodiment of the invention as used in the apparatus of FIG. 1.

Referring now to FIG. 4, in a flow chart diagram of the present data management system restoring a recording of the flight mode indicator, the DFDAU processor enters the flow chart subroutine at 54 and instructions 56 request the sampling of the flight mode indicator. Instructions 57 read the flight mode data block pointer (P), which is a dedicated four bit counter, and adds the present count value to the base address stored in PROM to determine the pointed address. Instructions 58 command storage of flight mode status at the address determined by instructions 57. Decision 59 determines if the last flight mode value indicated end of flight. If the answer is NO the data block pointer output remains the same and the processor exits the subroutine at 60. If YES instruction 61 commands the incrementing of the data block pointer by one state for the next flight, providing a new pointed address at which the ten flight mode indicator values will be recorded for the next succeeding flight. After which the processor again exits subroutine at 60.

Figure 5:
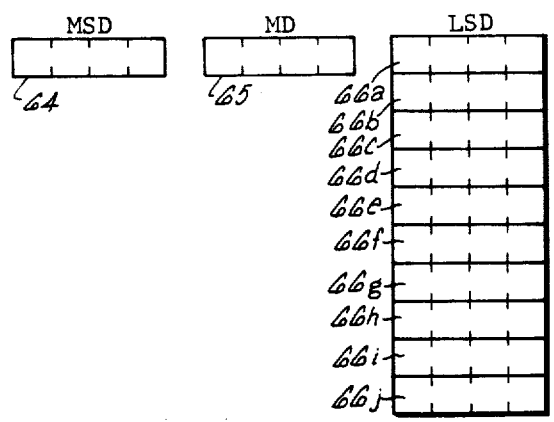
FIG. 5 is an illustration of one characteristic of the FIG. 1 apparatus as used in the description of the present invention.

As stated hereinbefore, the three digit BCD message itself is used to point to its own address in the data block. FIG. 5 illustrates the three digits 64–66, each including four bits to provide a 0–9 decimal output. The digit 64 is the most significant digit (MSD), the digit 65 is referred to as the middle digit and digit 66 is the least significant digit (LSD). The message counter tabulates messages between 0–999; the LSD has the highest frequency of use since it must be incremented on each occurrence of a message transfer whereas the middle digit (MD) is incremented every tenth message, i.e. decremented. In one particular DFDAU application the message count was incremented on the order of three times per flight which resulted in a frequency of write overs for the LSD three times greater than the maximum specified by the manufacturer. In this application the MD was used as the pointer to each of ten different buffers used to store the LSD bits. The MD value could be decoded directly, such that a MD value of zero points to the zero LSD buffer. A MD value of one points to the LSD one register, and so on. Each of the ten LSD registers are written over ten times; one decade of BCD count, but each are written to only once in each 100 increments of the count.

Figure 6:
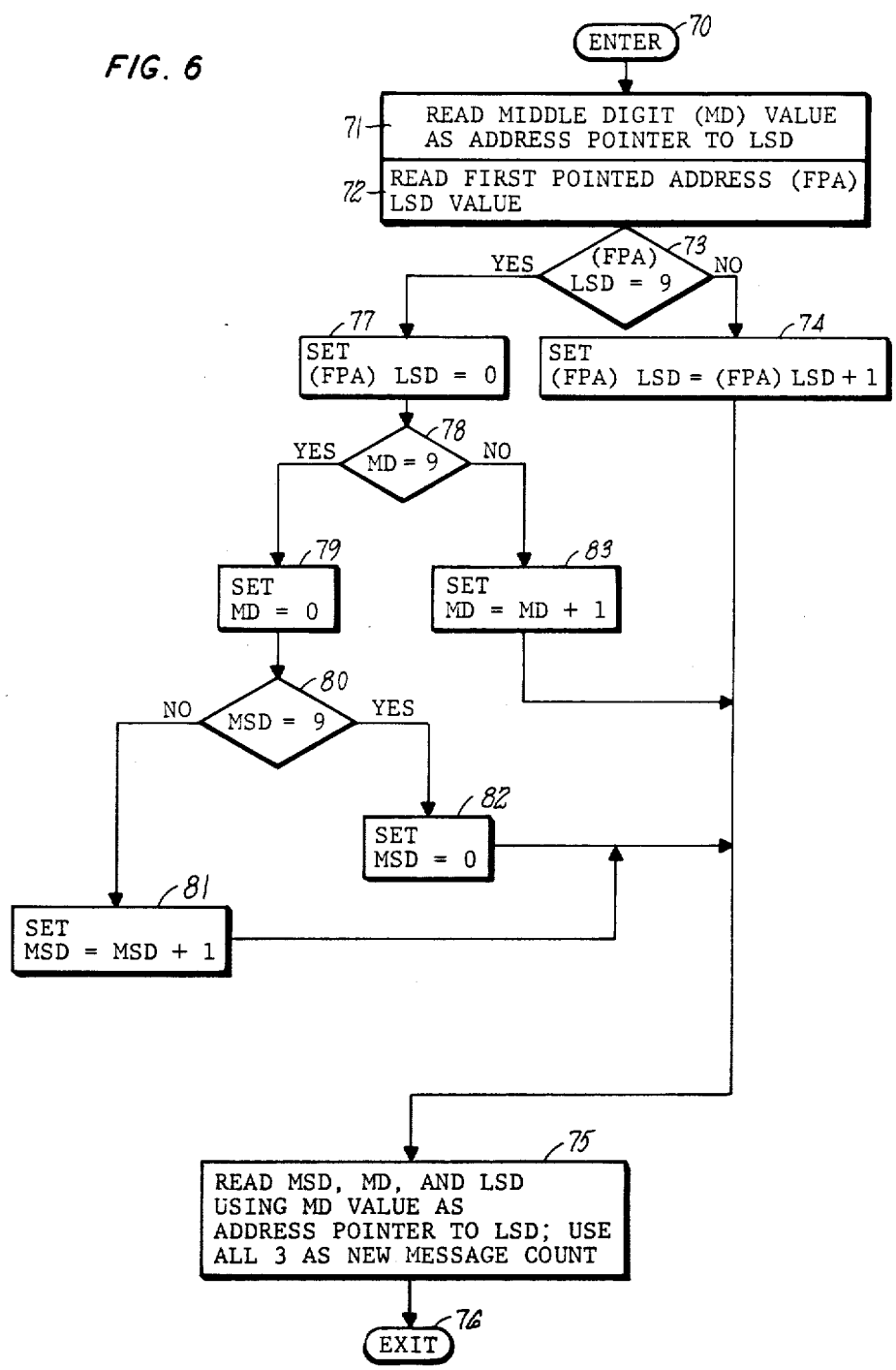
FIG. 6 is a flow chart diagram of another embodiment of the invention as used in the apparatus of FIG. 1.

FIG. 6 is a flow chart illustrating the steps performed by the DFDAU processor in storing the BCD message count. The processor enters the routine at 70 and instruction 71 reads the MD value and adds it to the message counter base address to provide the first pointed to address for the LSD register used to store the present BCD count. Instructions 72 read the first pointed address (FPA). Decision 73 determines if the FPA LSD register value is nine, (e.g. whether or not the message count value is coming up on a MD decrement). If NO, instructions 74 increment the FPA LSD register value by one to provide, in combination with the MSD and MD values, the present BCD message count. Instructions 75 read out of the MSD, MD and the recently stored LSD values as the new message count value, after which the processor exits the routine at 76.

If decision 73 is YES instructions 77 set the FPA LSD register value to zero. Decision 78 determines if the MD value is equal to nine. If YES, instructions 79 similarly set the MD value to zero, after which decision 80 determines whether or not the MSD is equal to nine. If NO, instructions 81 increment the MSD value after which the processor reads the newly incremented BCD values as the new message count in instruction 75. If the answer to decision 80 is YES, instructions 82 set the MSD value to zero prior to reading the BCD count in instructions 75.

In high recording frequency applications the data management system of the present invention ensures that the recording frequency of data in nonvolatile memory does not exceed the maximum recordings per address location specified by the manufacturer. This allows use of the specified statistical probability of failure values of the memory manufacturers. As described, there are various methods of rotating recorded data through data block address locations. The protocol involved is selectable. The address to be recorded is that identified by an address pointer which dictates that particular location at which the data is to be stored. In the preferred embodiment various pointer functions were illustrated, including a dedicated counter whose state count increments a base address to provide the pointed address, and the use of a data parameter itself to provide the pointed address to which its own sample value is to be stored.

Although the invention has been shown and described with respect to preferred embodiments thereof, it should be understood by those skilled in the art that various other changes, omissions, and additions may be made therein without departing from the spirit and scope of the invention.

What is claimed is:

1. A method of recording successive values of high sample frequency parameters in a nonvolatile memory having a plurality of addressable signal storage locations for storing digital data recorded therein over a maximum number of recording cycles, comprising the steps of:

identifying a data signal block for each high sample frequency parameter as including a plurality of addressable storage locations at least equal to the ratio of the predicted number of recordings of each high sample frequency parameter in a selected lifetime interval, divided by the maximum number of recording cycles specified for each location; and recording successive values of sample data in alternate ones of the data block signal locations so as to limit the number of recordings in each location to a number which is not greater than the maximum number of recording cycles specified.

2. The method of claim 1 wherein the step of recording each sample value includes the first step of pointing to the particular one of the addressable locations within the associated data signal block at which a present sample value is to be recorded, the particular pointed address being any one of said data block storage locations having less than said maximum specified number of recordings.

3. The method of claim 2, wherein said step of pointing identifies succeeding addressable storage locations for recording succeeding sample values of an associated data signal block, from a first location to a last location, in each of a number of recurring cycles equal to or less than the maximum specified for each location.

4. The method of claim 2, wherein said step of pointing identifies each data signal block storage location for recording, in turn, consecutive sample data values in each of a number of recurring cycles up to the maximum specified for each location, and if less than the maximum number is recorded at each location than to repeat the identification of each location in succesive cycles.

* * * * *